United States Patent [19]
Speiser et al.

[11] Patent Number: 4,792,787
[45] Date of Patent: Dec. 20, 1988

[54] WIDE DYNAMIC RANGE ANALOG-TO-DIGITAL CONVERTER USING LINEAR PREDICTION

[75] Inventors: Jeffrey M. Speiser; Harper J. Whitehouse; William H. McKnight, all of San Diego, Calif.

[73] Assignee: The United States of America as represented by the Secretary of the Navy, Washington, D.C.

[21] Appl. No.: 10,675

[22] Filed: Feb. 4, 1987

[51] Int. Cl.$^4$ ............................................. H03M 3/04
[52] U.S. Cl. ..................................... 341/156; 375/27; 375/28
[58] Field of Search ....... 340/347 AD, 347 C, 347 M; 375/27, 28

[56] References Cited

U.S. PATENT DOCUMENTS

| 3,262,107 | 7/1966 | Barber . | |
|---|---|---|---|
| 3,311,910 | 3/1967 | Doyle . | |
| 4,016,555 | 4/1977 | Tyrrel . | |
| 4,017,849 | 4/1977 | Tewksbury . | |
| 4,130,729 | 12/1978 | Gagnon | 381/31 X |
| 4,179,659 | 12/1979 | Tashiro | 375/27 |
| 4,179,710 | 12/1979 | Ishiguro et al. . | |
| 4,317,208 | 2/1982 | Araseki et al. . | |
| 4,319,082 | 3/1982 | Gilloire et al. . | |
| 4,385,393 | 5/1983 | Chaure et al. . | |

Primary Examiner—William M. Shoop, Jr.
Assistant Examiner—Richard K. Blum
Attorney, Agent, or Firm—Thomas G. Keough

[57] ABSTRACT

Improved dynamic range resolution or accuracy analog to digital conversion uses linear prediction. An open loop or feed-forward architecture passes an analog signal to a coarse or orthodox analog-to-digital converter that provides digital signals representing a most significant part of the output signal and offers them as inputs to a digital linear predictor whose digital output signal is reconverted to analog form and fed to an analog adder. An analog delay device may be used to receive the next analog sample and, after the proper delay (if needed), feed it to the adder where the difference between the analog predicted value and the analog signal is determined and passed to a subsequent coarse or orthodox analog to digital converter. A closed loop or feedback configuration receives the analog input signal data as well as a feedback predicted value in analog form and passes the difference to a coarse or orthodox analog to digital converter. A digital delay of the digital signal may be used to insure that the digital summing of prediction and digitized error signals occurs at the appropriate times. The recirculated predicted signal is converted to analog form (unless predicted via analog means) and subtracted from the analog input signal to provide an error signal output digitized to form low order bits that correspond in time with an output of high order bits generated by a digitized prediction signal. This arrangement improves the dynamic range, accuracy, resolution or number of resolvable signal levels in an analog to digital converter.

4 Claims, 6 Drawing Sheets $n \equiv$ time index
$a_{out}(n+1) = a_{in}(n)$
$b_{out}(n+1) = b_{in}(n)$
$c_{out}(n+1) = c_{in}(n) + a_{in}(n) * b_{in}(n)$ $y(n) = x(n-1)w_1 + x(n-2)w_2 + x(n-3)w_3 + x(n-4)w_4$

WIDE DYNAMIC RANGE ANALOG-TO-DIGITAL CONVERTER USING LINEAR PREDICTION

STATEMENT OF GOVERNMENT INTEREST

The invention described herein may be manufactured and used by or for the Government of the United States of America for governmental purposes without the payment of any royalties thereon or therefore.

BACKGROUND OF THE INVENTION

Current high performance signal processing techniques require that the data be in digital form. However, analog data coming, for example, from a wide variety of acoustic, optic, or electromagnetic sensors may exceed the conversion rates or precision of present day analog to digital converters and thus prevent or impede the real time processing of such data for meaningful results. As the need for more sophisticated data handling for improved sensitivity, precision, resolution, range, or the like materializes, data generation, conversion and/or handling capabilities often are exceeded. For example, the precision and data rates of analog to digital converters often are inadequate as are the switching times of interconnected processing circuitries.

Two (of numerous) methods by which a high speed analog to digital conversion can be effected are known as the flash method and the successive approximation method. Of the two, the faster method is the flash method which requires a number of comparators equal to $2^n - 1$ where n is the number of bits to be resolved. This technique in current practice is limited to 8-10 bits of resolution. The other method, binary successive approximation, is an analog to digital conversion technique that uses only a single comparator but requires n successive comparisons for n bit analog to digital conversion. A limitation of this technique is that it is significantly slower, on the order of a factor of n when compared to the flash method of analog to digital conversion, assuming that both use the same circuit technology. However, even when these two methods are considered, the presently available analog to digital converters do not have sufficient speed to permit high precision or wide dynamic range analog-to-digital conversion at the Nyquist rate or do not have a sufficient resolution to permit the application of modern signal processing techniques such as minimum variance distortionless look beamforming or eigenvector based direction finding.

Thus, there exists in the art a continuing need for improvements in analog to digital converter speed and resolution or dynamic range which would allow greater precision in the processing of received signals.

SUMMARY OF THE INVENTION

The present invention is directed to providing an improved means and method for extending the dynamic range or number of resolvable signal levels in analog to digital converters. In one particular embodiment, the open-loop or feed forward configuration, an analog signal is sampled at an appropriate rate, usually between 2 and 3 times the bandwidth of the analog input, and fed to an analog to digital (A/D) converter which provides digitally encoded signal samples. The A/D output consitutes the most significant part of the signal (high order bits) and is fed to associated processing equipment as well as to a digital linear predictor. Representative predicted signal values are reconverted to analog in a following digital to analog converter that thus provides a predicted value analog signal. An adder receives the analog predicted value signal and the next-in-sequence analog signal and algebraically adds them. A differencesignal from the adder is fed to a successive analog to digital converter where the digitized output represents the least significant part (low order bits) of the digital output signal. Subsequently, the high and low order bits thusly generated, are concatenated to form a wide dynamic range output data word. Optionally, this open loop or feed forward architecture can feature an analog linear predictor, thus obviating the need for a D/A converter altogether and offering the predictor output to the analog summing junction directly as well as A/D converting it for the high order bits. In another emodiment the means and method include a feedback loop for the digital form of the difference signal (perhaps after an appropriate delay) to improve prediction accuracy by iteratively updating the prediction and thus the difference signals. In addition, the feedback loop may eliminate the need for an analog delay of the subsequent quantized signal. The quantized residual after prediction is utilized in subsequent linear predictions to thereby improve the data which is provided as an input to the predictor. In other words, the digitized error signal is recirculated and added to recursive linear predictions to further improve the data which is provided as an input to the digital predictor.

An object of the invention is to improve the operation of analog to digital converters by the incorporation of linear prediction techniques.

Another object of the invention is to provide for improved dynamic range and number of resolvable signal levels in any frequency range including the megahertz and/or gigahertz range by an analog to digital converter.

A further object is to provide for improved digitization accuracy, resolution, speed and dynamic range by using difference signals generated by linear prediction techniques.

Yet still a further object of the invention is to provide for increased accuracy resolution and dynamic range within any frequency range including megahertz and/or gigahertz spectra by using linear predictive coding.

Still yet a further object of the invention is to provide for a method of improving the operation of an analog to digital converter for the conversion of data from a sensor array such as an array of antennas or hydrophones.

These and other objects of the invention will become more readily apparent from the ensuing specification when taken together with the drawings.

DESCRIPTION OF THE PREFERRED EMBODIMENT

Figure 1:
FIG. 1 depicts a linear system wherby the output is the convolution of the input with a system response or system impulse response.

Referring now to FIG. 1 of the drawings, a linear system produces an output as a linear combination or convolution of an input with a system response (e.g., set of coefficients). This is expressed mathematically as $$y(n) = \sum_{k=1}^{N} x(n - k) w_k$$

where $y(n)$ is the nth output data sample, $x(n)$ is the nth input data sample and $w_k$ is the kth weighting factor or coefficient.

Figure 2:
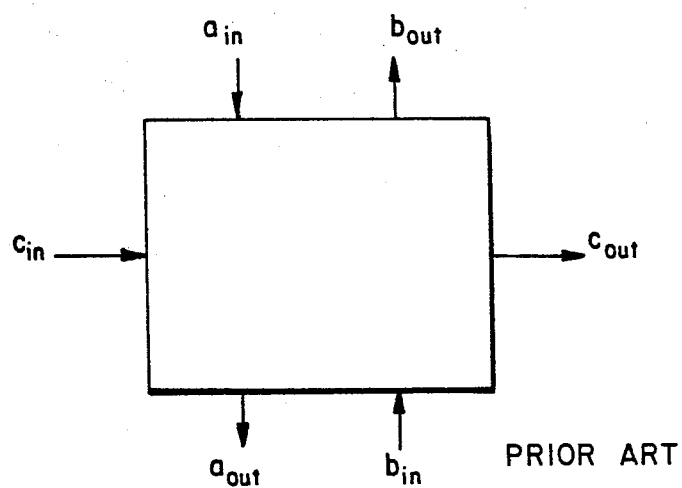
FIG. 2 depicts H. T. Kung's inner product step processor as a linear system with more precisely defined inputs and outputs.
Figure 3:
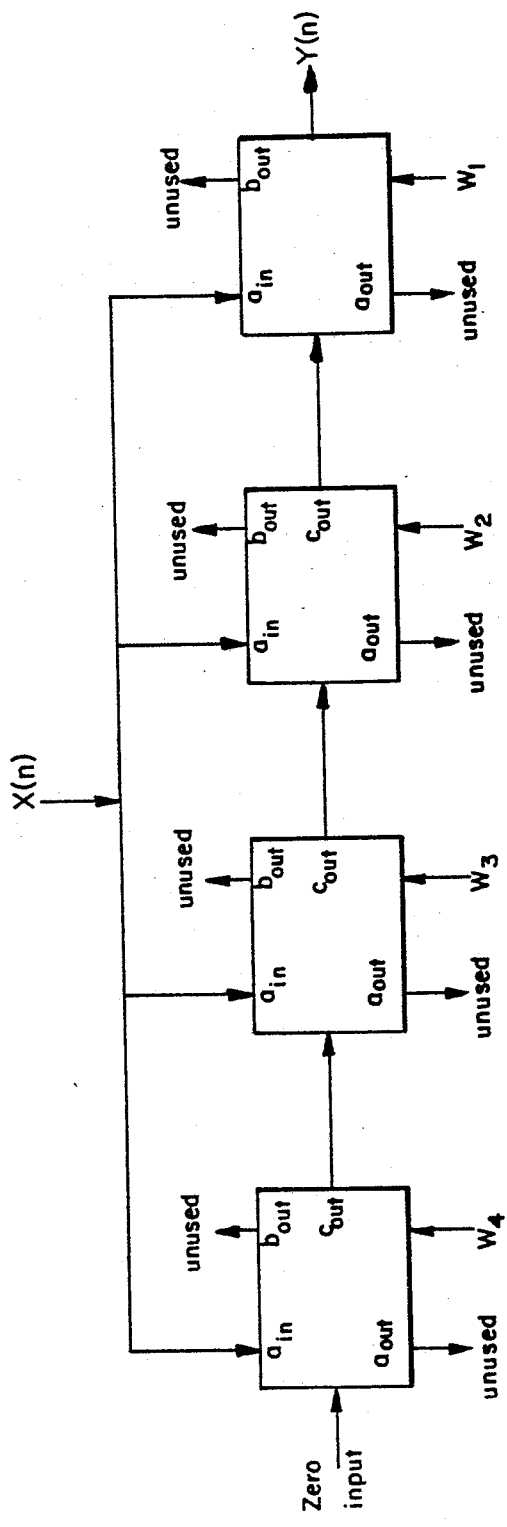
FIG. 3 depicts a specific architectural arrangement of H. T. Kung's inner product step processor featuring complete parallelism which yields minimum latency.

Looking to FIG. 2 of the drawings, a general purpose linear system processing element with more specifically defined inputs and outputs can be used in a (highly parallel) systolic architectural arrangement to achieve transversal filtering as shown in FIG. 3. The output from the H. T. Kung inner product step processor of FIG. 2 is mathematically expressed as $C_{out}(n+1) = C_{in}(n) + a_{in}(n) * b_{in}(n)$ where the index n defines the sequential sample number or time index $a_{out}(n+1) = a_{in}(n)$ and $b_{out}(n+1) = b_{in}(n)$. A more detailed and thorough explanation of this concept is to be found in H. T. Kung's article, "Why Systolic Architecture", *IEEE Computer*, January 1982, pp 37-46.

FIG. 3 further shows the systolic architecture for parallel processing using the general processing element of FIG. 2. The compelling feature of FIG. 3 is the greatly reduced latency achieved by broadcasting the input and preserving intermediate results. In other words, the intermediate results (of previous calculations) are passed from element to element with simultaneous new input added at each step or clock cycle. Thus the final (right-hand) element has all previous calculations passed to it (from its adjacent element) and only awaits the next most recent input data sample to give its final output with latency time equal only to the time for one multiply and add. That is, the filtered output sample $y(n)$, based on input sample $x(n)$ (and previous others) is available in the time required for one multiply and one add. FIG. 3 shows a prediction filter of length $N=4$ taps.

Figure 4:
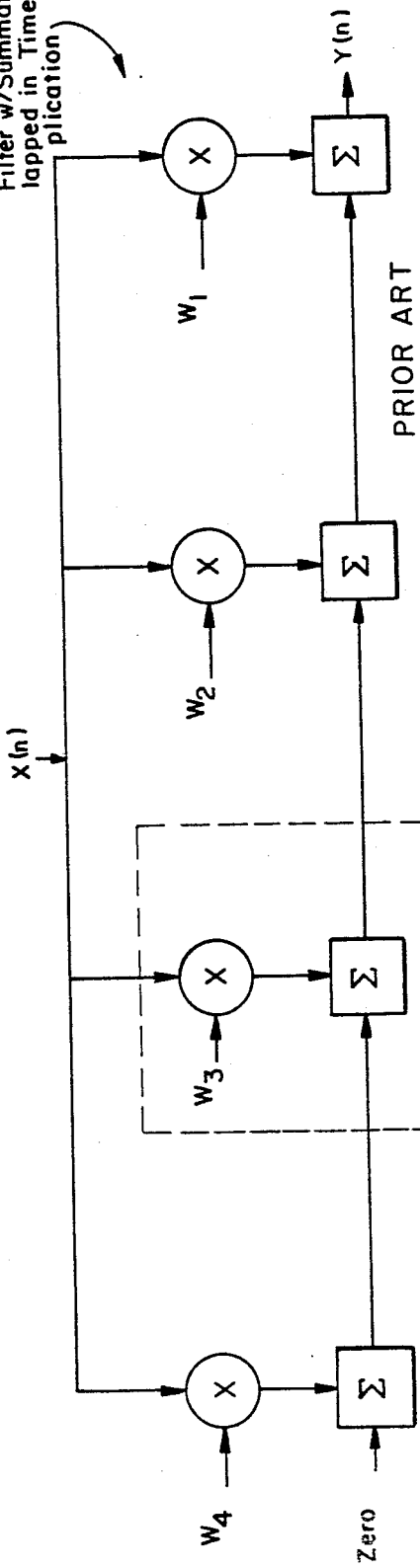
FIG. 4 depicts a simplified special case of FIG. 3 showing only those operatins required for a transversal (prediction) filter. The systolic transversal filter has unit latency (shown for N=4 taps). The sample time can be as short as multiplication time plus add time. In this configuration $a_{out}$ and $b_{out}$ are unused. [Adapted from H. T. Kung "Why Systolic Architecture", *IEEE. Computers* January 1982, pp 37-46.]

FIG. 4 shows (also for $N=4$ taps) a simplified version of FIG. 3 where unused ports (inputs/outputs) are left out and only the multiply and add operations needed to achieve the transversal prediction filtering are shown. The systolic transversal filter has summation overlapped in time with multiplication. The (parallel) systolic architecture is, of course, the same as FIG. 3 and thus so is the minimum latency.

Figure 5:
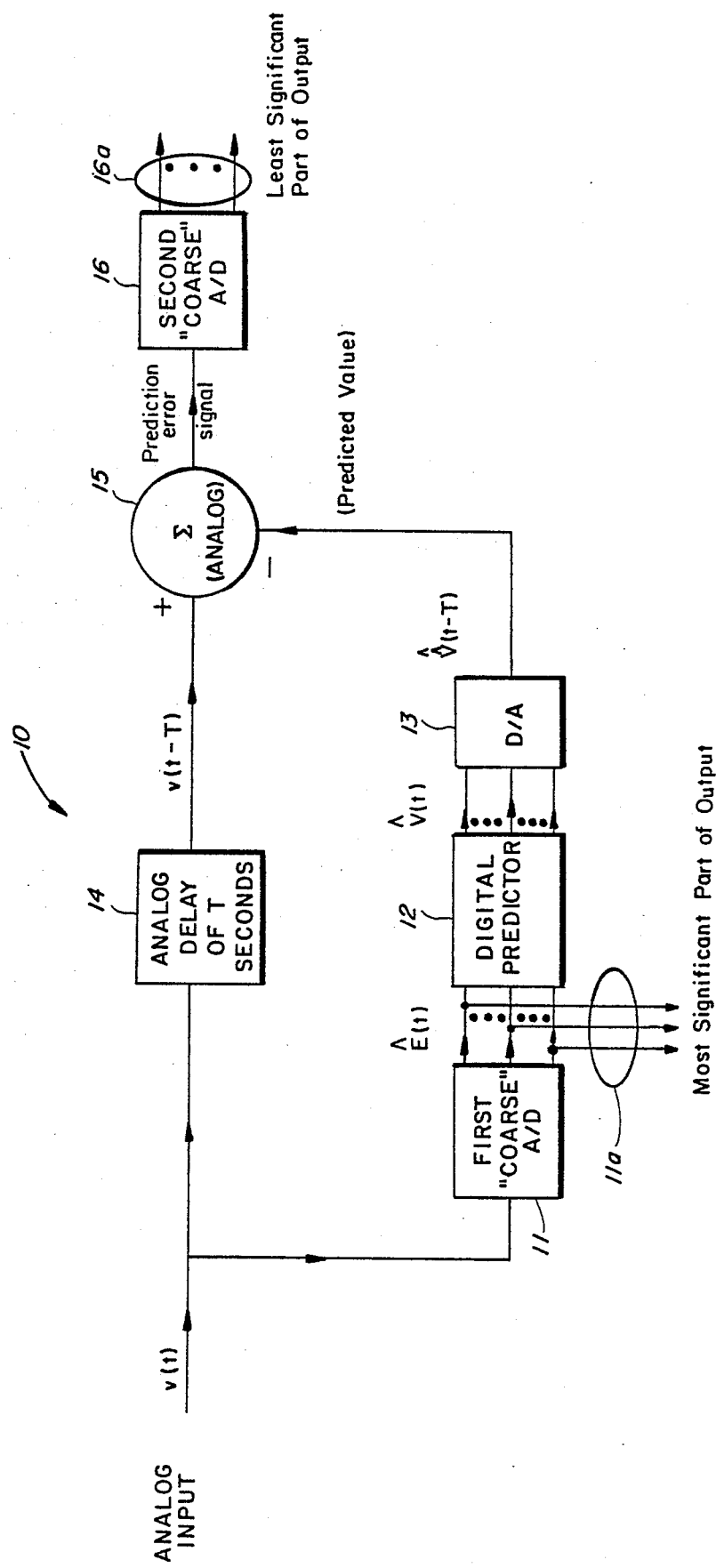
FIG. 5 shows an open loop or feed-forward configuration for a linear predictive analog-to-digital converter which utilizes a digital predictor.

Referring now to FIG. 5 of the drawings, an analog input signal $v(t)$ is fed to an open-loop configuration of the wide dynamic range converter 10. A first "coarse" or orthodox analog to digital converter, 11, receives the signal and "coarsely" digitizes the input signal samples to provide a representative digital output signal $E(t)$. The term "coarse" or orthodox in this instance refers to an analog to digital converter in which one obtains the greatest dynamic range available from current art A/D converters.

This invention may utilize several alternative forms of linear predictor. One class of predictor uses past data to estimate the data covariance matrix and then solves Gauss's normal equations. A typical method in this class is Durbin's Method. A text by L. R. Rabiner and R. W. Schafer, *Digital Processing of Speech Signals*, Prentice-Hall, Inc., Englewood Cliffs, N.J., 1978, pages 411-413 provides sufficient theoretical and practical explanation for solving for the predictor coefficients by applying Durbin's recursive solution. Implementation of linear prediction techniques is explained further by John Makhoul in his article entitled "Linear Prediction: A Tutorial Review", *Proc. IEEE* 63, #4, April 1975, pages 561-580. Prediction techniques based on the normal equations using the past N data samples unfortunately require a number of arithmetic operations on the order of $N^2$, $O(N^2)$, even when fast algorithms such as Durbin's Method are used to solve the normal equations. Newer methods such as those of Brown or Splettstosser have the important advantage of not requiring knowledge or estimation of the covariance matrix, only knowing an upper bound on the signal bandwidth. In these methods the prediction filter weights are computed in advance, before the hardware is even built. The predictor may then be realized as a fixed-weight filter in one of several forms: transversal, recursive or lattice. The transversal filter form, especially the systolic transversal filters of H. T. Kung, provides a simple implementation which gives the real-time output updating needed here. The sampling time may be as short as one multiply time plus one add time. The article by J. L. Brown, Jr. entitled "Uniform Linear Prediction of Bandlimited Processes from Past Samples,"*IEEE Transactions on Information Theory*, September 1972 elaborates on a bandwidth-limited application of the linear prediction technique. Another exemplary teaching in this field is by W. Splettstosser entitled "On the Prediction of Band-Limited Signals from Past Samples" *Information Sciences* 28 pp 115-130 (1982). Also see Wainstein and Zubakov, *Extraction of Signals From Noise*, chapter 2, Prentice Hall Inc. (1962). These articles along with a host of prior art publications provide one skilled in the art to which this invention pertains with a sufficient theoretical background and practical knowledge for implementation of the algorithms by the components to be identified.

Linear predictive coding of speech from which the linear predictive analysis firmly establishes itself is also developed by Rabiner and Schafer, pages 396 et seq. The text establishes the difference between differential pulse code modulation (DPCM) coding and basic linear prediction. DPCM finds a predictor that will reduce the variance of the difference signal so that quantization error can be reduced. That is separate and distinct from the more general viewpoint as how the basic linear prediction idea lends itself to a set of analysis techniques that can be used to estimate parameters of a speech model. The Rabiner and Schafer dissertation concerns speech, however, the linear predictive coding technique has been found in this inventive concept to be applicable to analog to digital conversion to provide enhanced dynamic range, resolution or accuracy in the digital output.

Differential pulse code modulation (DPCM) schemes at first glance appear to be close to employing linear predictive techniques. However most DPCM digitizers provide an output where only the digitized (coded) error signal is transmitted, see for example the apparatus for analog to digital conversion taught by S. K. Tewksbury in his U.S. Pat. No. 4,017,849. In contradistinction to his DPCM technique the improvement of this inventive concept uses this digitized error as low order bits for concatenated data words with predictor output as high-order bits thus giving a greatly enhanced dynamic range in the digital data output.

A predictive encoder with a non-linear quantizing characteristic as disclosed by T. Ishiguro et al in their U.S. Pat. No. 4,179,710 suppresses redundant single components without enhancing the range of analog to digital conversion. The T. I. Ishiguro et al teachings are cited herein to show the state of the art as far as what is well known to those skilled in the art as far as the fabrication of the constituents of their encoder. In like manner, the constituents of the adaptive DPCM system of T. Araseki in U.S. Pat. No. 4,317,208 are concerned with speech or the like in which the predictor output is not part of the final signal output. The Araseki et al ADPCM system appears to represent a step forward in frequency band compression for speech or the like within the particular range requirements of a specific quantizer.

The improved dynamic range analog to digital converter employing linear prediction techniques embraced by this inventive concept requires that the predictor output explicitly form a most significant part of the final digitized data word so that general A to D conversion will encompass enhanced dynamic range.

Noting FIG. 5, input analog waveform V(t) fed to first coarse A to D converter 11 is digitized in accordance with well-known methods. The most significant part of the digital output signal is tapped-off at 11a from the output of the A to D converter to form a part of the digitized signal that is representative of an enhanced dynamic range dititally encoded input analog signal. Digital output signals (from 11) having the waveform Ê(t) are fed to digital predictor 12 which provides an output signal (t) that is calculated from suitable predictor coefficients and which is representative of a future signal sample. The (t) values are coupled to an interconnected digital to analog converter 13 whose output is an analog linear prediction signal V̂(t−T) of the next signal value.

This analog input signal V(t) value is (concurrently with the lower signal path) passed through an analog delay circuit 14 having a delay appropriate (e.g. T seconds) for matching the actual (analog) signal via the upper path and its analog predicted value (via the lower path) on a time basis. An analog adder device 15 receives the analog predicted value, V̂(t−T), and the subsequent actual (analog) signal value, V(t−T), subtracts the two and passes the error signal therefrom to a second "coarse" analog to digital converter, 16, where least significant part digital outputs at 16a are representative of the digitized difference between the predicted value and the actual value of the signal. It is to be noted that the most significant part of the output coming from analog to digital converter 11 at 11a $L$ is concatenated *with the least significant part of the output signal coming from the analog to digital converter 16 at 16a* to provide a composite digital signal that is representative of a wider dynamic range of analog input signal V(t).

In general, the error caused by a coarse quantization of the prediction error will correspond to a extremely small quantization error in the original signal. Hence, the output from the serially connected second coarse analog to digital converter 16 represents a signal with but an extremely small quantization error. If the next signalsample can be predicted with about n bits of accuracy, then ideally 2 n-bit A to D converters can be used in this configuration 11 and 16 to permit a reconstruction of an input signal with about 2 n bits of accuracy. If the signal is known to be approximately represented by a stationary random process, then the performance of this configuration can be approximately calculated from a knowledge of the spectral density function of the random process. A fuller understanding of the validity of this approximation can be had by noting the analysis set forth by E. J. Hannan in *Time Series Analysis*, Science Paperbacks and Methuen and Co., Ltd., 1960, reprinted 1967, pages 20–24. In general, when the spectral density function has pronounced peaks and dips, accurate prediction will be possible. This will typically be the case when the waveform to be quantized includes a strong narrowband interferring source together with a much weaker signal of interest, i.e., the resolution is improved when most needed for applications such as adaptive interference cancellation.

Figure 6:
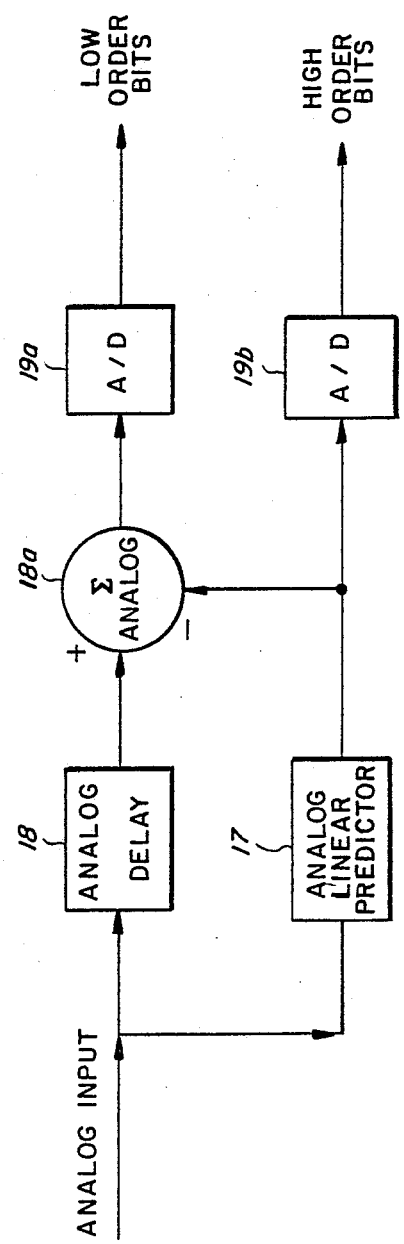
FIG. 6 depicts a variation of the feed-forward configuration featuring an analog linear predictor.

Noting FIG. 6, a variation of the open-loop or feedforward configuration features an analog linear predictor instead of a digital one as previously described. This obviates the need for the digital to analog converter, 13, in the previous open-loop/digital predictor configuration. In FIG. 6 the analog input is fed simultaneously to an analog linear predictor, 17 and an analog delay device, 18. The analog linear predictor output represents the predicted analog value of the signal at a subsequent time. As in FIG. 5, this predictor output is subtracted at the summing junction, 18a, from the delayed actual analog signal such that the differenced values are coincident in time. The difference or error signal is digitized at 19a and output as the low order bits of the enhanced dynamics range digital data word. The analog linear predictor output is also digitized by 19b whose output forms the high order bits of the enhanced dynamic range digital data word. Care must be taken or means must be provided to ensure time synchronization such that the high and low order bits reflect the signal value at the same point in time.

Figure 7:
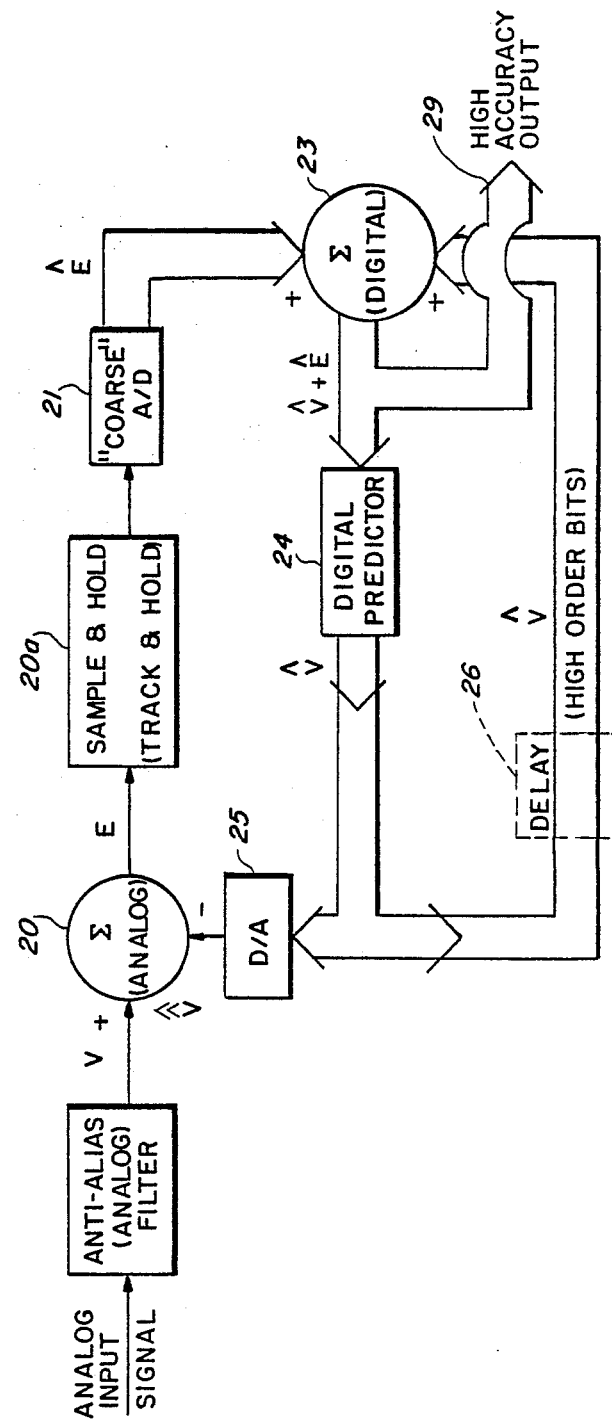
FIG. 7 shows a closed loop or feed-back configuration for a linear predictive analog-to-digital converter featuring a digital linear predictor.

Improved performance can be built into the embodiment thus described by restructuring it as a closed-loop or feed-back configuration as set out in FIG. 7. The embodiment of FIG. 7 increases the accuracy by eliminating the analog delay needed in the upper paths in FIGS. 5 and 6. Further, whereas the digital predictor in FIG. 1 uses only the coarsely quantized data produced by the first coarse A to D, 11, the embodiment of FIG. 7 utilizes the quantized residual after digitization to improve the data which is provided as an input to the predictor.

Looking now to FIG. 7, when the system is first turned on and no past data are available the predicted value is zero. That is, both the digital predicted value (t) and its analog representation V̂(t) are zero, so that E=V, and the output of a coarse A/D converter, 21, Ê(t), in FIG. 7 is the same as that of the first coarse A/D, 11, in FIG. 1. At this time the input to a digital predictor, 24, of FIG. 7 is a coarsely quantized version of the input signal V(t). If the signal is predictable, then $\hat{V}(t)$ will approximate V(t) and the subsequent residuals E and their digitized representation $\hat{E}$ will become and remain small. Since the digital predictor, 24, in FIG. 7 has available both previously predicted values from the lower loop and the resulting digitized residuals (prediction errors) from the upper loop, it has a more precise representation of the data on which to base its predictions.

It will also be noted that the configuration of FIG. 7 uses only digital delays when/if necessary (these should be much easier to implement accurately). The only high accuracy analog operation required in this configuration is the subtraction in the upper left-hand portion of the figure at adder 20. An analog adder, 20, feeds an (analog) error signal E(t) to a sample and hold amplifier, 20a, followed by a coarse analog to digital converter, 21, that provides a digitized error signal, $\hat{E}(t)$. A digital delay may need to be incorporated in the A/D converter, 21, to impose a suitable delay, possibly equal to the sum of the times for operation of digital summation in a summer, 23, to produce $+\hat{E}$, the time for a digital prediction in a digital predictor, 24, to produce as well as the time it takes for a digital to analog converter, 25, to reconvert the signals back to analog form $\hat{V}$. Optionally, digital delay device 26, may be included in the lower recursive feed-back loop that feeds a prediction signal to digital summer, 23, in order to insure that the proper corresponding time samples of and e,cir/E/ are engaged at 23.

The output signal from the digital summer, 23, is $+\hat{E}$ and is fed to digital predictor 24 which in turn generates a new (digital) prediction signal . This output from the digital summer also constitutes the ultimate output as an enhanced dynamic range digital data word, output at point 29. If required, digital delay, 26, receives the digital prediction signal, , and circulates it to digital summer 23. Any delay incorporated in the A/D, 21, of the upper loop is correlated with delay device 26 (when/if needed) so as to insure proper timing such that high and low order bits added at summing junction 23 correspond to the same time samples.

Figure 8:
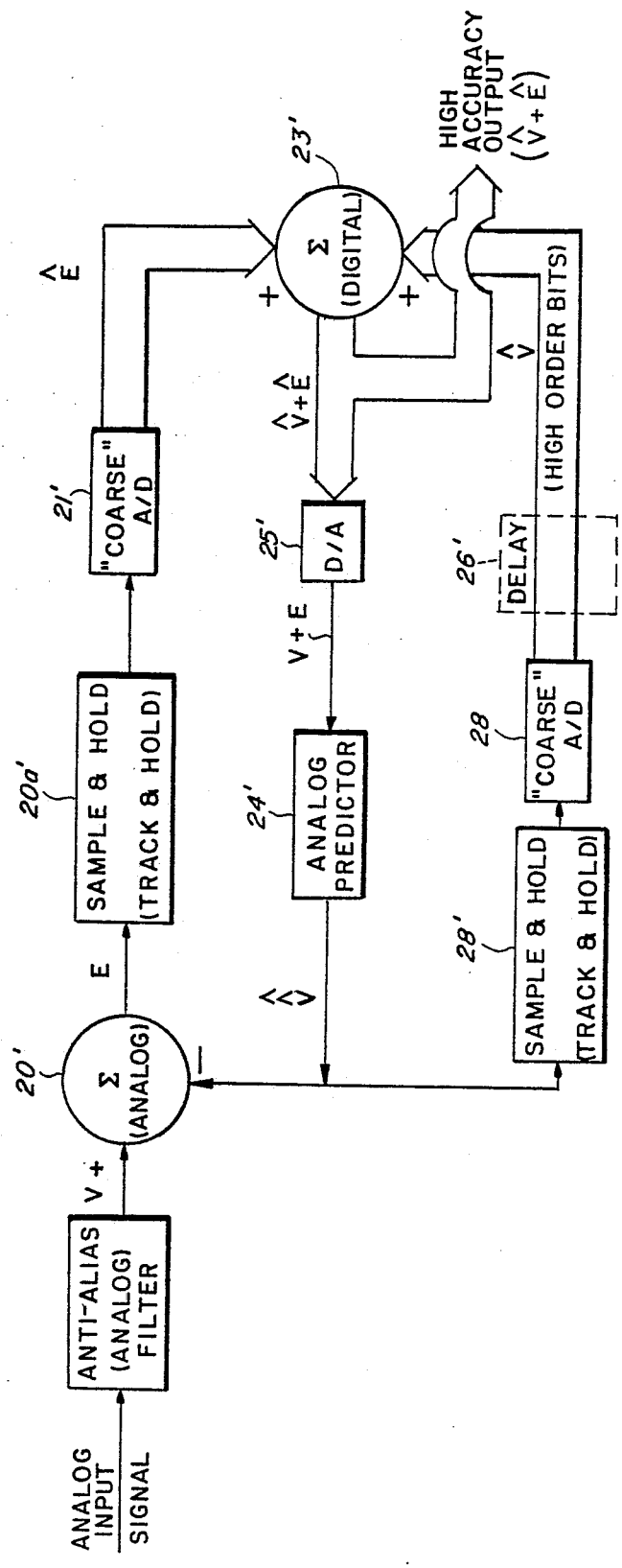
FIG. 8 shows a closed loop or feed-back configuration for a linear predictive analog-do-digital converter featuring an analog liner predictor.

In reference to FIG. 8, a closed-loop or feedback configuration is depicted which features an analog predictor, 24', (as opposed to the digital predictor, 24, of FIG. 7) and an additional "coarse" A/D converter, 28, placed in the lower feedback loop. It optionally having a built in delay of a suitable duration to insure synchronization. A sample-and-hold, 28', is included in this leg also. The function of the architecture and elements of FIG. 8 is similar to that of FIG. 7 except it should be noted that the D/A converter, 25', of FIG. 8 requires a greater precision of operation than that of its counterpart, 25, of FIG. 7. This could present an accuracy limitation for the predictor input. The possible use of delay device 26' in the lower loop of FIG. 8 is to be coordinated with any delay required to be incorporated in A/D converter 21' of the upper loop in FIG. 8. This coincident timing concept is similar to that previously described for the digital predictor closed-loop or feedback configuration of FIG. 7.

A rapid development of very large scale digital integrated circuits has greatly reduced the cost of computation, whether the cost is measured in dollars, chip area or power consumption. This rapid development has also greatly enhanced computational rates or throughput for digital signal processing. For many applications this would permit the use of advanced digital signal processing techniques and algorithms provided that accurately digitized data were available. This inventive concept advantageously employs additional computation incorporating a linear predictor and an analog to digital converter to further improve accuracy, resolution, and dynamic range of the A/D converter. The digitized prediction error or difference signal is used as low order bits for a concatenated output data word that includes high order bits from the (digitized) linear prediction, thus giving a greatly enhanced dynamic range digital data word output. Its principal new feature is the use of computations based on previous data to provide prediction signals which permit digitization with improved accuracy.

When the strongest signal present is highly predictable, ultimate A/D resolution by this inventive method may approach 2 n bits using n-bit A/D converters. The linear predictor can be implemented in several ways. Well known methods would solve the normal equations via a Toeplitz linear equation solver using the Levinson-Trench or Durbin algorithm as set out in the Rabiner and Schafer text above. The predictor also may be implemented as a Toeplitz linear equation solver using the S. Y. Kung parallel architecture or as a least squares lattice predictor, see, for instance, the article by McWhirter and Shephard entitled "Least-Squares Lattice Algorithm for Adaptive Channel Equalization", *IEEE Proceedings*, Vol. 130, Part F, No. 6, October, 1983, pp. 532–543. A particularly attractive high speed approach to linear prediction is to use the fixed-weight filter techniques of Brown and Splettstosser, supra, implemented using the systolic transversal filters of H. T. Kung.

For analog to digital conversion of data from a sensor array such as an array of antennas, optical detectors or hydrophones, each predictive analog to digital converter may utilize the quantized data produced by other A/D converters. To see that this may be advantageous, consider the case of a strong plane wave propagating across a uniformly spaced line array at any arrival direction other than broadside. Clearly, as the wavefront moves across the array, element outputs are predictable from the outputs of previously crossed elements, even when the signal is of short duration (such as transient or pulse) which cannot generally be predicted in the time domain using any single sensor. In such a manner the bandwidth capabilities of the discrete sensor outputs can be enhanced by use of the linear predictive technique as disclosed herein.

"Uniform Linear Prediction of Band Limited Processes from Past Samples, *IEEE Transactions on Information Theory*, September 1972 elaborates on a bandwidth limited application of a linear prediction technique.

Obviously, many modifications and variations of the present invention are possible in the light of the above teachings. It is therefore to be understood that within the scope of the appended claims the invention may be practiced otherwise than as specifically described.

We claim:

1. An apparatus receiving an input analog signal V(t) for optionally increasing the accuracy, resolution, dynamic range and the number of resolvable signal levels in successive analog-to-digital conversions with concatenated high order bits and low order bits comprising:

means receiving the input signal V(t) for the algebraically summing with a prediction signal $\hat{V}$(t), to produce a difference (error) signal, E(t);

means coupled to the summing means for converting the difference (error) signal from analog to digital form, $\hat{E}$(t);

means coupled to receive the $\hat{E}$(t) signal for digitally summing it with a recirculated prediction signal (t) to produce increased dynamic range signals $\hat{E}$(t)+ (t) at an output from the apparatus made up from concatenated high order bits and low order bits, respectively;

means connected to receive the increased dynamic range signals (t)+$\hat{E}$(t) from the digital summing means for generating digital linear prediction signals (t);

means coupled to receive the digital linear prediction signals (t) for recirculating them back to the digital summing means; and means connected to the digital linear prediction signal generating means for effecting a digital to analog conversion of the digital liner prediction output signals (t) to the prediction signals $\hat{V}$(t) and connecting it to the algebraic summing means.

2. An apparatus according to claim 1 further including:

means coupled to receive the digital linear prediction signals (t) for delaying them an appropriate time and coupling the delayed linear prediction signals to the recirculating means.

3. An apparatus according to claim 2 in which the analog to digital converting means includes a delay means for delaying the signal $\hat{E}$(t) an appropriate amount.

4. An apparatus according to claim 3 in which the digital linear prediction signals generating means has a fixed weight transversal filter implemented by a plurality of suitably interconnected inner-product step processors.

* * * * *